United States Patent [19]

McDougall et al.

[11] Patent Number: 5,331,282
[45] Date of Patent: Jul. 19, 1994

[54] MAGNETIC FIELD GENERATING ASSEMBLY

[75] Inventors: Ian L. McDougall, Oxon; Peter Hanley, Gloucestershire; Robert C. Hawkes, Cambridge, all of Great Britain

[73] Assignee: Oxford Instruments (UK) Limited, Oxford, Great Britain

[21] Appl. No.: 917,057

[22] PCT Filed: Feb. 7, 1991

[86] PCT No.: PCT/GB91/00194
§ 371 Date: Aug. 7, 1992
§ 102(e) Date: Aug. 7, 1992

[87] PCT Pub. No.: WO91/12538
PCT Pub. Date: Aug. 22, 1991

[30] Foreign Application Priority Data
Feb. 8, 1990 [GB] United Kingdom ............... 9002863

[51] Int. Cl.$^5$ ............................................. G01V 3/00
[52] U.S. Cl. .................................... 324/319; 324/320
[58] Field of Search ............... 324/318, 319, 320, 307, 324/309; 335/299, 296

[56] References Cited

U.S. PATENT DOCUMENTS

| | | | |
|---|---|---|---|
| 4,656,423 | 4/1987 | Sugimoto | 324/309 |
| 4,701,736 | 10/1987 | McDougall et al. | 335/299 |
| 4,721,914 | 1/1988 | Fukushima et al. | 324/320 |
| 4,875,485 | 10/1989 | Matsutani | 324/318 |
| 5,138,326 | 8/1992 | Edwards et al. | 324/319 |

FOREIGN PATENT DOCUMENTS

| | | |
|---|---|---|
| 0160350 | 11/1985 | . |
| 0186998 | 7/1986 | . |
| 0399789 | 11/1990 | . |
| 2052069 | 1/1981 | United Kingdom . |
| 2070254 | 9/1981 | United Kingdom . |

*Primary Examiner*—Louis Arana

[57] ABSTRACT

A magnetic field generating assembly having at least two magnetic fields in the same sense. The generators are arranged such that, in use in a working region external to the generators, the resultant magnetic field exhibits a gradient extending in a first direction and at least second order variations in the fields in directions transverse to the first direction within the working region are substantially balanced such that an NMR experiment can be performed on a sample within the working region in accordance with the related method. The magnetic electrical field generators are substantially coaxial electrical coils, wherein the axis extends in the first direction.

14 Claims, 4 Drawing Sheets

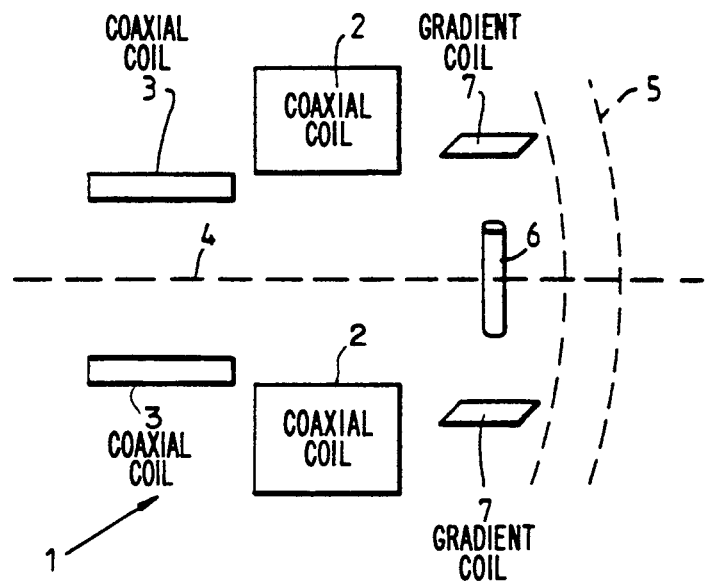
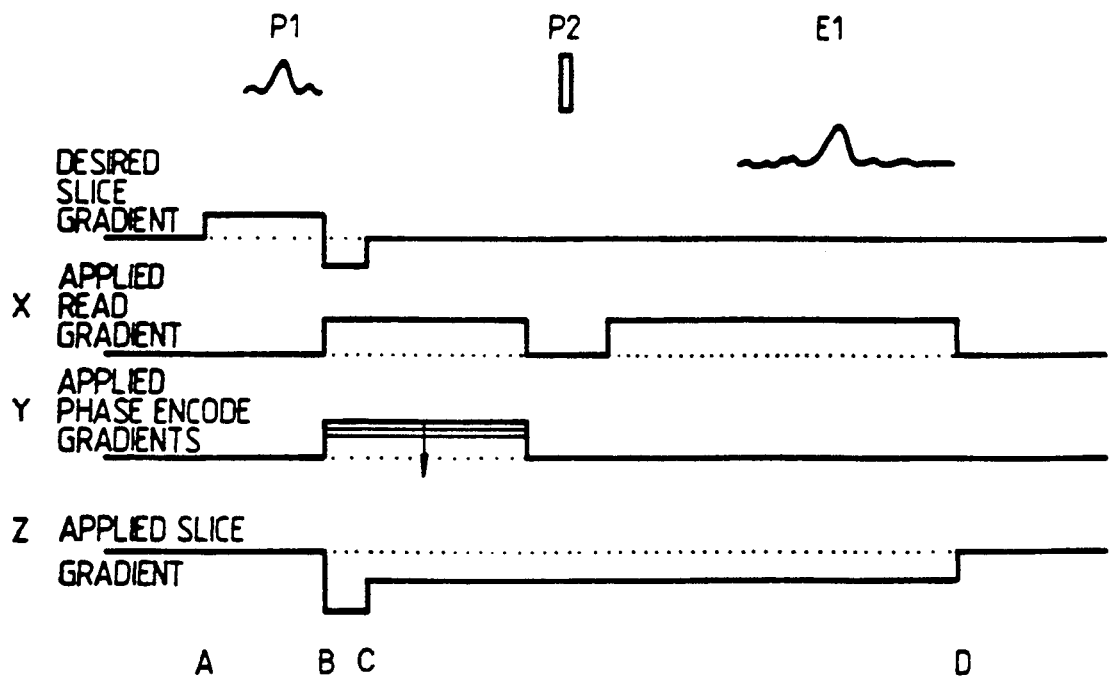

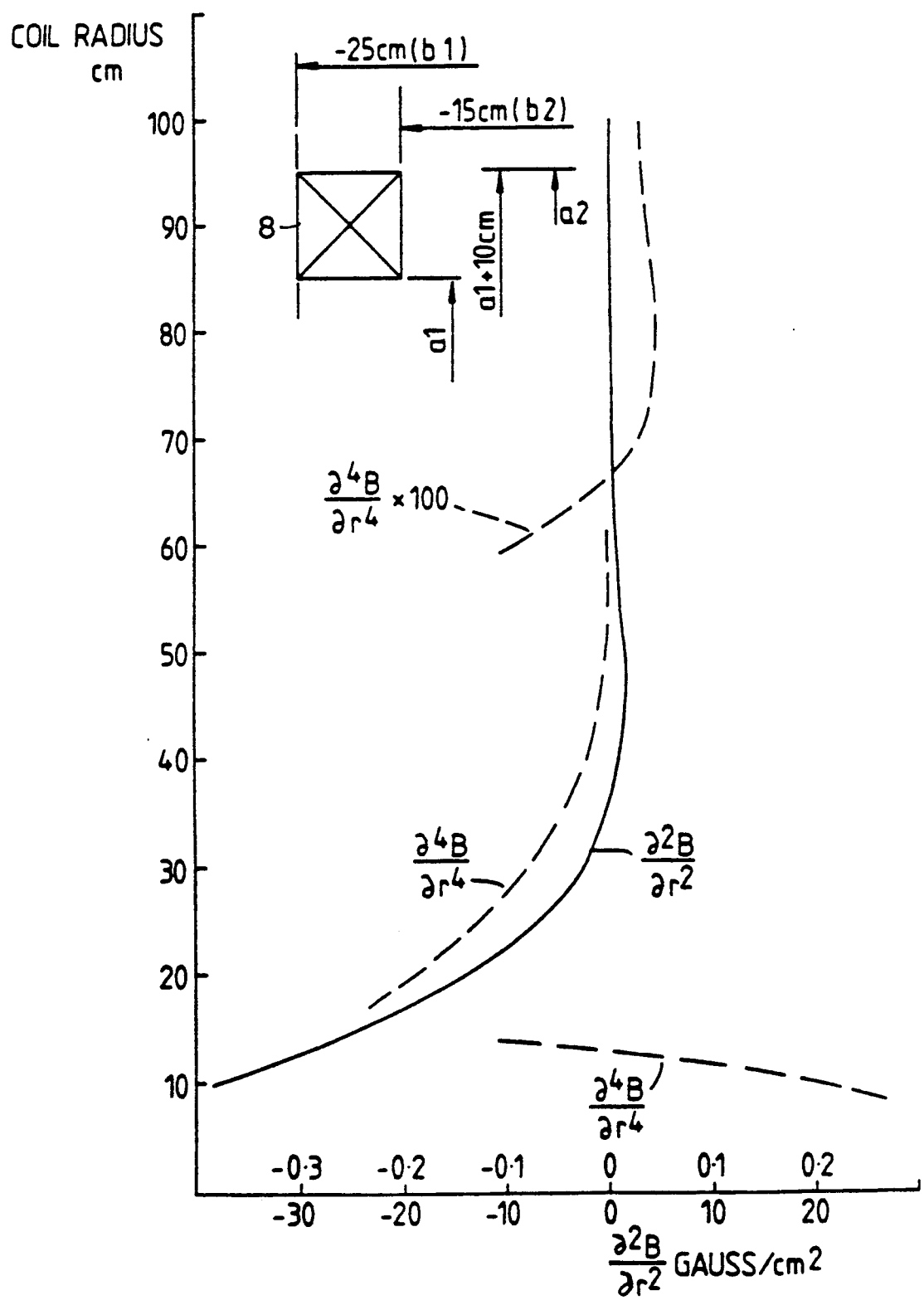

MAGNETIC FIELD GENERATING ASSEMBLY

BACKGROUND OF THE INVENTION

The invention relates to a magnetic field generating assembly and to apparatus for performing a nuclear magnetic resonance (NMR) experiment using such an assembly.

In the field of nuclear magnetic resonance, it is necessary to generate within a working volume a substantially homogenous magnetic field to enable the NMR characteristics of molecules within the working volume to be examined. Conventionally, this has been achieved by making use of a coil assembly at the centre of which an approximately spherical region having a homogeneous magnetic field is generated. Such an assembly is described in U.S. Pat. No. 4,656,423. This has proved satisfactory in the case of NMR imaging of the human body and also NMR spectroscopy. However, there is a need to be able to perform NMR experiments on relatively large bodies, for example polymer composites such as aircraft parts and the like and the cost of manufacturing a magnet of a conventional form into which the body can be placed is so large as to be prohibitive.

Samoilenko et al JETP Lett. Vol. 47, No 7, 10 Apr. 1988, describe how large field gradients within conventional high resolution NMR magnets can provide sufficient field gradient to facilitate a selected region of the order of 0.1 mm with the application of an rf pulse only. However, again the working region is confined within the magnet.

Recently, attempts have been made to change the location of the homogenous, working volume and in one such attempt described in U.S. Pat. No. 4,701,736 a magnet is described in which the spherical homogeneous region is projected outside the volume of the magnet. A number of nested, counter running coils are used. This suffers from the disadvantages firstly that more power (in a resistive system) or more superconducting material (in a superconducting system) is required to produce a given field strength in the working volume; and secondly the working volume is spherical which is not particularly suitable for certain applications.

A second assembly for generating a substantially homogeneous region projected from the assembly is described in EP-A-0186998 which comprises a number of coil sets with their axes substantially parallel and spaced apart and this requires an undesirable amount of superconductor (in the case of superconducting magnets) or power (in the case of resistive magnets) to achieve a given field strength.

SUMMARY OF THE INVENTION

In accordance with one aspect of the present invention, a magnetic field generating assembly comprises at least two magnetic field generators for generating magnetic fields having substantially coaxial portions extending in the same sense, the generators being arranged such that in use in a working region external to the generators the resultant magnetic field exhibits a gradient extending in a first direction, and wherein at least the second order variations in the fields in directions transverse to the first direction within the region are substantially balanced such that an NMR experiment can be performed on a sample within the working region.

In this assembly, it is possible to arrange for two or more magnetic field generators to generate substantially coaxial fields in the same sense and arrange for the second order variations in the field in directions transverse to the one direction to balance in the working region, thereby generating a relatively large working region spaced from the generators.

Although the magnetic field generators could comprise permanent magnets, preferably the generators comprise substantially coaxial, electrical coils, most preferably the coils generating fields extending in the first direction. If superconducting coils are used, these could be fabricated from the recently developed high temperature superconducting materials.

As will be explained below, it can be shown that the second (and fourth) radial derivatives of the magnetic fields exhibit changes in sign depending upon the radius of the coil. Consequently, by suitable choice of coil radius it is possible to cancel at least the second (and higher radial derivatives) with a pair of coils.

In some examples, the centres of the coils will be offset axially.

Typically, the working region will be generally dish shaped although it could also be substantially planar.

The dimensions of the working region and the degree of homogeneity in directions transverse to the first direction will depend upon the NMR experiment being performed, the RF frequencies used, and the signal-to-noise ratio desired. Typically, however, the homogeneity transverse to the first direction will be better than 100 ppm.

In practice, the working region will have a significant dimension in the first direction so that effectively a set of homogeneous regions are generated along the first direction. This has the advantage that since a gradient field is exhibited along the first direction, spatial information can be obtained from an object which intersects more than one of the homogeneous regions.

As explained above, the assembly is particularly suitable for use in apparatus for performing an NMR experiment, the apparatus further comprising RF field generating means for generating an RF magnetic field in the working region; and detection means for detecting the resultant signal echo. Typically, the apparatus will further comprise gradient field generating means for imposing gradient fields within the working region to enable spatial information to be obtained.

The invention has many applications but is particularly suitable for obtaining NMR information from objects of relatively large size which cannot be inserted into a conventional coil based system. For example, until now, no method has been suggested to allow the introduction of polymer composites on a commercial scale to be achieved. For example, aircraft frames and aerofoils are made of such polymer composites and there is a need to provide as much information as possible both about manufacturing processes and service status. NMR is uniquely placed to inspect the manufacturing process for response to the thermal treatment applied to polymerise the molecular structure of plastic matrices. The difficulties of correctly treating large, complex shaped pieces are substantial and for critical airframe components, must be reliably overcome. It has been shown, for example, that water can eventually infiltrate polymer structures and modify mechanical performance. Again, NMR is uniquely placed to provide chemical information that quantifies the extent of solvent ingression. Furthermore, many manufacturers in the polymer manufacturing business need to develop new fabrication and assembly techniques for complex components. This has been difficult to achieve up until now due to the unavailability of suitable non-destructive testing instruments.

In accordance with a second aspect of the present invention, a method of inspecting a structure comprises generating a set of substantially planar or curved regions in each of which a magnetic field is generated which is substantially homogeneous, the magnitude of the field within each region differing between the regions; positioning a structure to be inspected such that it intersects at least one of the homogeneous working regions; exposing the structure to a RF pulse at a predetermined frequency band to excite nuclear magnetic resonance within the structure; and monitoring the resulting signal echo.

With this method, large polymer composites such as airframe components and the like can be inspected using nuclear magnetic resonance and it should be noted that in contrast to known NMR apparatus which superimposes magnetic field gradients in order to define that part of the structure which is to be examined, the invention can be used to achieve spatial resolution by suitably choosing the RF frequency.

Typically, the method will be performed using a magnetic field generating assembly according to the first aspect of the invention.

BRIEF DESCRIPTION OF THE DRAWINGS

An example of a method and apparatus according to the invention will now be described with reference to the accompanying drawings, in which:

FIG. 1 is a schematic diagram of the apparatus;

FIG. 2 illustrates graphically the variation in second and fourth order radial derivatives with coil radius of the magnetic field due to a single coil.

FIG. 5 illustrates a typical pulse sequence for use with the invention.

DESCRIPTION OF THE PREFERRED EMBODIMENTS

Figure 3:
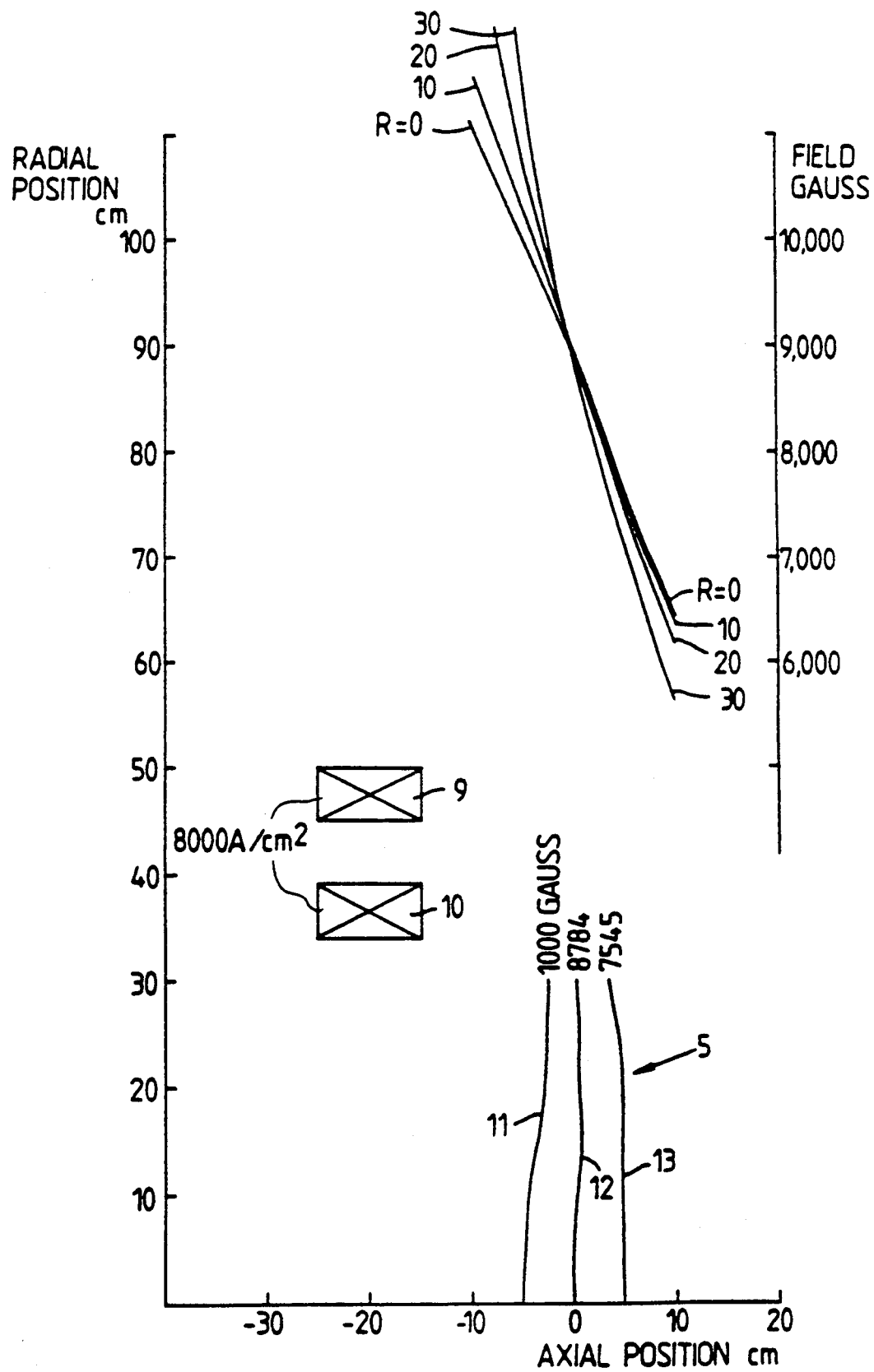
FIG. 3 illustrates graphically an example of a coil assembly according to the invention.

FIG. 1 illustrates an example of NMR apparatus in schematic form which comprises a coil assembly 1 described in more detail below in connection with FIG. 4. The apparatus comprises a pair of coaxial, superconducting coils 2,3 spaced apart along a common axis 4. The coils 2,3 will be housed in a conventional cryostat (not shown). As explained below, the coils are positioned so as to generate in a working region 5 a magnetic field which exhibits a linear gradient along the axis 4 and is substantially homogeneous in the direction orthogonal to the axis 4. Consequently, the working region 5 defines a region suitable for performing an NMR experiment. The apparatus includes an RF coil 6 positioned to generate an RF magnetic field orthogonal to the direction of the magnetic field within the working region and also to detect resultant signal echoes. Finally, conventional gradient coils 7 may be provided to superimpose gradients in directions orthogonal to the axis or within the working region 5.

The invention will be described by way of example in connection with a working region 5 situated 15 cm away from the nearest part of the coil 2. This distance will provide space for mechanical supports and, in the case of superconducting coils, cryogenic components. A system will be described such that the radial extent of the working region is about 30 cm so as to provide an area of more than 0.25 m².

It is necessary to consider the radial variation of field at the point of interest. The field at a point R on the surface of the working region 5 can be written as a Taylor expansion about the axis 4 (the Z axis):

$$B(R,Z) = B(O,Z) + \frac{R^2}{2!} \frac{d^2B}{dR^2} + \frac{R^4}{4!} \frac{d^4B}{dR^4} + \cdots$$

Because of the symmetry, only the even terms appear. To obtain a set of flat, evenly spaced surfaces, one should seek a coil system where the radial derivatives sum to zero. The greater the number of derivatives one can make sufficiently small, the larger will be the radial extent of the working volume.

The calculation of the radial derivatives is not so straightforward as for the axial ones. Where computer programs for calculating off-axis fields are available, the radial derivatives may be obtained either by fitting a polynomial to a radial field plot, or by numerical differentiation. These techniques are known to people skilled in the art and will not be descried in detail. FIG. 2 shows the second and fourth radial derivatives for a coil 8 (8000 turn/cm²) plotted as a function of the radius of the coil. It can be seen that the second derivative goes through zero and changes sign from negative to positive at about a radius of 35 cm in this case. The fourth derivative changes sign twice at about 12 cm and 65 cm. This gives us sufficient degrees of freedom to cancel with the region 5 the second derivatives with a pair of coils or to cancel both second and fourth derivatives simultaneously with a system of three coils. The data used to generate FIG. 2 is given in Table 1 below. In this Table, the dimensions a1, b1, a2 and b2 are as shown in FIG. 2 while the zero to 4th order derivatives of axial field are denoted by H0-H4 respectively.

TABLE 1

| Coil Position 1 | | |
|---|---|---|
| a1 | cm | 1.000E+001 |
| a2 | | 2.000E+001 |
| b1 | | −2.500E+001 |
| b2 | | −1.500E+001 |
| highest order | | 4.000E+000 |
| Radial derivatives gauss, cm units | | |
| H0 = 7.358E+003 | | H1 = 0.000E+000 |
| H2 = −3.777E+001 | | H3 = 0.000E+000 |
| H4 = 2.010E−001 | | |
| Coil Position 2 | | |
| a1 | cm | 2.000E+001 |
| a2 | | 3.000E+001 |
| b1 | | −2.500E+001 |
| b2 | | −1.500E+001 |
| highest order | | 4.000E+000 |
| H0 = 9.587E+003 | | H1 = 0.000E+000 |
| H2 = −1.329E+001 | | H3 = 0.000E+000 |
| H4 = −1.899E−001 | | |
| Coil Position 3 | | |
| a1 | cm | 3.000E+001 |
| a2 | | 4.000E+001 |
| b1 | | −2.500E+001 |
| b2 | | −1.500E+001 |
| highest order | | 4.000E+000 |
| H0 = 9.393E+003 | | H1 = 0.000E+000 |
| H2 = −2.139E+000 | | H3 = 0.000E+000 |
| H4 = −7.542E−002 | | |
| Coil Position 4 | | |
| a1 | cm | 4.000E+001 |
| a2 | | 5.000E+001 |
| b1 | | −2.500E+001 |

TABLE 1-continued

| | |
|---|---|
| b2 | −1.500E+001 |
| highest order | 4.000E+000 |
| H0 = 8.515E+003 | H1 = 0.000E+000 |
| H2 = 8.395E−001 | H3 = 0.000E+000 |
| H4 = −2.158E−002 | |

Coil Position 5

| | | |
|---|---|---|
| a1 | cm | 5.000E+001 |
| a2 | | 6.000E+001 |
| b1 | | −2.500E+001 |
| b2 | | −1.500E+001 |
| highest order | | 4.000E+000 |
| H0 = 7.579E+003 | | H1 = 0.000E+000 |
| H2 = 1.350E+000 | | H3 = 0.000E+000 |
| H4 = −5.393E−003 | | |

Coil Position 6

| | | |
|---|---|---|
| a1 | cm | 6.000E+001 |
| a2 | | 7.000E+001 |
| b1 | | −2.500E+001 |
| b2 | | −1.500E+001 |
| highest order | | 4.000E+000 |
| H0 = 6.747E+003 | | H1 = 0.000E+000 |
| H2 = 1.237E+000 | | H3 = 0.000E+000 |
| H4 = −9.096E−004 | | |

Coil Position 7

| | | |
|---|---|---|
| a1 | cm | 7.000E+001 |
| a2 | | 8.000E+001 |
| b1 | | −2.500E+001 |
| b2 | | −1.500E+001 |
| highest order | | 4.000E+000 |
| H0 = 6.042E+003 | | H1 = 0.000E+000 |
| H2 = 1.011E+000 | | H3 = 0.000E+000 |
| H4 = 2.356E−004 | | |

Coil Position 8

| | | |
|---|---|---|
| a1 | cm | 8.000E+001 |
| a2 | | 9.000E+001 |
| b1 | | −2.500E+001 |
| b2 | | −1.500E+001 |
| highest order | | 4.000E+000 |
| H0 = 5.452E+003 | | H1 = 0.000E+000 |
| H2 = 8.013E−001 | | H3 = 0.000E+000 |
| H4 = 4.457E−004 | | |

Coil Position 9

| | | |
|---|---|---|
| a1 | cm | 9.000E+001 |
| a2 | | 1.000E+002 |
| b1 | | −2.500E+001 |
| b2 | | −1.500E+001 |
| highest order | | 4.000E+000 |
| H0 = 4.956E+003 | | H1 = 0.000E+000 |
| H2 = 6.322E−001 | | H3 = 0.000E+000 |
| H4 = 4.101E−004 | | |

Coil Position 10

| | | |
|---|---|---|
| a1 | cm | 1.000E+002 |
| a2 | | 1.100E+002 |
| b1 | | −2.500E+001 |
| b2 | | −1.500E+001 |
| highest order | | 4.000E+000 |
| H0 = 4.536E+003 | | H1 = 0.000E+000 |
| H2 = 5.016E−001 | | H3 = 0.000E+000 |
| H4 = 3.266E−004 | | |

FIG. 3 shows a simple example of a two-coil system formed by coils 9,10. FIG. 3 has two sections, the main section illustrating contours of constant field labelled 11-13 corresponding to field values of 10,001, 8784, and 7545 gauss respectively while the second section of FIG. 3 illustrates the variation in total field strength along the axis of the assembly at different radii. Each coil has a turn density of 8000 amp/cm$^2$. The data used to generate FIG. 3 is given in Table 2 below. In this Table, the values Hmod are plotted, where Hmod$^2$=Hr$^2$+Hz$^2$, and Hr, Hz are the radial and axial field components respectively. It will be appreciated that only some of the field plots are shown in FIG. 3.

TABLE 2

| | | |
|---|---|---|
| Coil 10 | | |
| a1 | cm | 3.400E+001 |
| a2 | | 3.900E+001 |
| b1 | | −2.500E+001 |
| b2 | | −1.500E+001 |
| highest order | | 4.000/E+000 |
| Coil 9 | | |
| a1 | cm | 4.500E+001 |
| a2 | | 5.000E+001 |
| b1 | | −2.500E+001 |
| b2 | | −1.500E+001 |
| highest order | | 4.000E+000 |

Radial derivatives

| | |
|---|---|
| H0 = 8.748E+003 | H1 = 0.000E+000 |
| H2 = −3.996E−002 | H3 = 0.000E+000 |
| H4 = −3.823E−002 | |

Field plots

| Z | Hr | hz | Hmod |
|---|---|---|---|
| R 0.000E+000 | | | |
| −1.000E+001 | 0.000E+000 | 1.109E+004 | 1.109E+004 |
| −7.500E+000 | 0.000E+000 | 1.058E+004 | 1.058E+004 |
| −5.000E+000 | 0.000E+000 | 1.001E+004 | 1.001E+004 |
| −2.500E+000 | 0.000E+000 | 9.408E+003 | 9.408E+003 |
| 0.000E+000 | 0.000E+000 | 8.784E+000 | 8.784E+003 |
| 2.500E+000 | 0.000E+000 | 8.158E+003 | 8.158E+003 |
| 5.000E+000 | 0.000E+000 | 7.545E+003 | 7.545E+003 |
| 7.500E+000 | 0.000E+000 | 6.953E+003 | 6.953E+003 |
| 1.000E+001 | 0.000E+000 | 6.390E+003 | 6.390E+003 |
| R 5.000E+000 | | | |
| −1.000E+001 | 4.801E+002 | 1.117E+004 | 1.118E+004 |
| −7.500E+000 | 5.520E+002 | 1.064E+004 | 1.066E+004 |
| −5.000E+000 | 6.005E+002 | 1.005E+004 | 1.007E+004 |
| −2.500E+000 | 6.273E+002 | 9.426E+003 | 9.447E+003 |
| 0.000E+000 | 6.352E+002 | 8.785E+003 | 8.808E+003 |
| 2.500E+000 | 6.277E+002 | 8.145E+003 | 8.169E+003 |
| 5.000E+000 | 6.085E+002 | 7.521E+003 | 7.546E+003 |
| 7.500E+000 | 5.808E+002 | 6.923E+003 | 6.947E+003 |
| 1.000E+001 | 5.476E+002 | 6.356E+003 | 6.379E+003 |

TABLE 2-continued

| | | | |
|---|---|---|---|
| R 1.000E+001 | | | |
| −1.000E+001 | 1.032E+003 | 1.142E+004 | 1.147E+004 |
| −7.500E+000 | 1.176E+003 | 1.082E+004 | 1.088E+004 |
| −5.000E+000 | 1.268E+003 | 1.016E+004 | 1.024E+004 |
| −2.500E+000 | 1.312E+003 | 9.409E+003 | 9.559E+003 |
| 0.000E+000 | 1.317E+003 | 8.775E+003 | 8.873E+003 |
| 2.500E+000 | 1.290E+003 | 8.095E+003 | 8.198E+003 |
| 5.000E+000 | 1.242E+003 | 7.442E+003 | 7.545E+003 |
| 7.500E+000 | 1.177E+003 | 6.824E+003 | 6.925E+003 |
| 1.000E+000 | 1.104E+003 | 6.246E+003 | 6.343E+003 |
| R 1.500E+001 | | | |
| −1.000E+001 | 1.756E+003 | 1.186E+004 | 1.199E+004 |
| −7.500E+000 | 1.966E+003 | 1.110E+004 | 1.127E+004 |
| −5.000E+000 | 2.081E+003 | 1.030E+004 | 1.051E+004 |
| −2.500E+000 | 2.117E+003 | 9.500E+003 | 9.733E+003 |
| 0.000E+000 | 2.090E+003 | 8.718E+003 | 8.965E+003 |
| 2.500E+000 | 2.019E+003 | 7.974E+003 | 8.225E+003 |
| 5.000E+000 | 1.918E+003 | 7.277E+003 | 7.526E+003 |
| 7.500E+000 | 1.800E+003 | 6.633E+003 | 6.873E+003 |
| 1.000E+001 | 1.672E+003 | 6.042E+003 | 6.269E+003 |
| R 2.000E+001 | | | |
| −1.000E+001 | 2.819E+003 | 1.246E+004 | 1.277E+004 |
| −7.500E+000 | 3.059E+003 | 1.143E+004 | 1.183E+004 |
| −5.000E+000 | 3.141E+003 | 1.041E+004 | 1.087E+004 |
| −2.500E+000 | 3.100E+003 | 9.435E+003 | 9.934E+003 |
| 0.000E+000 | 2.993E+003 | 8.535E+003 | 9.045E+003 |
| 2.500E+000 | 2.831E+003 | 7.715E+003 | 8.218E+003 |
| 5.000E+000 | 2.642E+003 | 6.975E+003 | 7.459E+003 |
| 7.500E+000 | 2.443E+003 | 6.311E+003 | 6.767E+003 |
| 1.000E+001 | 2.242E+003 | 5.717E+003 | 6.141E+003 |
| R 2.500E+001 | | | |
| −1.000E+001 | 4.532E+003 | 1.311E+004 | 1.387E+004 |
| −7.500E+000 | 4.653E+003 | 1.162E+004 | 1.251E+004 |
| −5.000E+000 | 4.549E+003 | 1.028E+004 | 1.124E+004 |
| −2.500E+000 | 4.318E+003 | 9.108E+003 | 1.008E+004 |
| 0.000E+000 | 4.023E+003 | 8.097E+003 | 9.041E+003 |
| 2.500E+000 | 3.705E+003 | 7.224E+003 | 8.119E+003 |
| 5.000E+000 | 3.385E+003 | 7.224E+003 | 7.301E+003 |
| 7.500E+000 | 3.076E+003 | 5.812E+003 | 6.576E+003 |
| 1.000E+001 | 2.785E+003 | 5.240E+003 | 5.934E+003 |
| R 3.000E+001 | | | |
| −1.000E+001 | 7.388E+003 | 1.320E+004 | 1.512E+004 |
| −7.500E+000 | 6.889E+003 | 1.111E+004 | 1.307E+004 |
| −5.000E+000 | 6.275E+003 | 9.514E+003 | 1.140E+004 |
| −2.500E+000 | 5.658E+003 | 8.254E+003 | 1.001E+004 |
| 0.000E+000 | 5.077E+003 | 7.237E+003 | 8.840E+003 |
| 2.500E+000 | 4.545E+003 | 6.399E+003 | 7.849E+003 |
| 5.000E+000 | 4.065E+003 | 5.698E+003 | 6.999E+003 |
| 7.500E+000 | 3.634E+003 | 5.104E+003 | 6.265E+003 |
| 1.000E+001 | 3.249E+003 | 4.595E+003 | 5.628E+003 |
| Contour plots | | | |
| R | Z | dB/dZ | error |
| Z −5.000E+000 | | | |
| 0.000E+000 | −5.000E+000 | −2.345E+002 | 1.001E+004 |
| 2.500E+000 | −4.941E+000 | −2.367E+002 | 8.387E−006 |
| 5.000E+000 | −4.770E+000 | −2.431E+002 | 2.506E−005 |
| 7.500E+000 | −4.504E+000 | −2.537E+002 | 4.037E−005 |
| 1.000E+000 | −4.168E+000 | −2.685E+002 | 5.354E−005 |
| 1.250E+000 | −3.789E+000 | −2.874E+002 | 6.261E−005 |
| 1.500E+000 | −3.401E+000 | −3.102E+002 | 6.436E−005 |
| 1.750E+000 | −3.034E+000 | −3.367E+002 | 5.890E−005 |
| 2.000E+000 | −2.718E+000 | −3.669E+002 | 4.281E−005 |
| 2.250E+000 | −2.481E+000 | −4.004E+002 | 1.921E−005 |
| 2.500E+000 | −2.351E+000 | −4.365E+002 | 2.340E−006 |
| 2.750E+000 | −2.353E+000 | −4.743E+002 | 1.950E−007 |
| 3.000E+000 | −2.512E+000 | −5.117E+002 | 5.715E−005 |
| Z 0.000E+000 | | | |
| 0.000E+000 | 0.000E+000 | −2.500E+002 | 8.784E+003 |
| 2.500E+000 | 2.358E−002 | −2.514E+002 | 3.002E−006 |
| 5.000E+000 | 9.162E−002 | −2.555E+002 | 8.116E−006 |
| 7.500E+000 | 1.966E−001 | −2.623E+002 | 1.223E−005 |
| 1.000E+000 | 3.268E−001 | −2.718E+002 | 1.490E−005 |
| 1.250E+000 | 4.673E−001 | −2.839E+002 | 1.534E−005 |
| 1.500E+000 | 6.004E−001 | −2.986E+002 | 1.323E−005 |
| 1.750E+000 | 7.071E−001 | −3.158E+002 | 8.560E−006 |
| 2.000E+000 | 7.674E−001 | −3.353E+002 | 3.002E−006 |
| 2.250E+000 | 7.610E−001 | −3.569E+002 | 1.112E−007 |
| 2.500E+000 | 6.672E−001 | −3.800E+002 | 7.115E−006 |
| 2.750E+000 | 4.651E−001 | −4.040E+002 | 3.491E−005 |
| 3.000E+000 | 1.331E−001 | −4.278E+002 | 9.272E−005 |

TABLE 2-continued

| Z 5.000E+000 | | | |
|---|---|---|---|
| 0.000E+000 | 5.000E+000 | −2.411E+002 | 7.545E+003 |
| 2.500E+000 | 5.002E+000 | −2.420E+002 | 6.472E−008 |
| 5.000E+000 | 5.006E+000 | −2.445E+002 | 3.236E−007 |
| 7.500E+000 | 5.008E+000 | −2.487E+002 | 1.942E−007 |
| 1.000E+000 | 5.002E+000 | −2.545E+002 | 3.883E−007 |
| 1.250E+000 | 4.980E+000 | −2.620E+002 | 1.294E−006 |
| 1.500E+000 | 4.931E+000 | −2.710E+002 | 1.877E−006 |
| 1.750E+000 | 4.845E+000 | −2.815E+002 | 1.489E−006 |
| 2.000E+000 | 4.707E+000 | −2.934E+002 | 1.489E−006 |
| 2.250E+000 | 4.505E+000 | −3.064E+002 | 1.016E−005 |
| 2.500E+000 | 4.223E+000 | −3.203E+002 | 2.796E−005 |
| 2.750E+000 | 3.845E+000 | −3.348E+002 | 5.889E−005 |
| 3.000E+000 | 3.355E+000 | −3.492E+002 | 1.058E−004 |

As can be seen in FIG. 3, the working region 5 has substantially flat surfaces effectively defined by the 10,001 and 7545 gauss contours. This system is dominated by the fourth derivative which could be cancelled by making use of a third coil. However, it is possible to exploit the variation of the radial gradients with the axial position of the coils to achieve this without the need for a third coil. This is illustrated in FIG. 4 which is similar to FIG. 3 but for a system such as that shown schematically in FIG. 1 in which coils 11, 12 are offset along a common axis. This achieves the same cancellation of second order radial gradients as in FIG. 3 but has a lower fourth derivative due to the greater axial distance of the inner coil from the working region.

Figure 4:
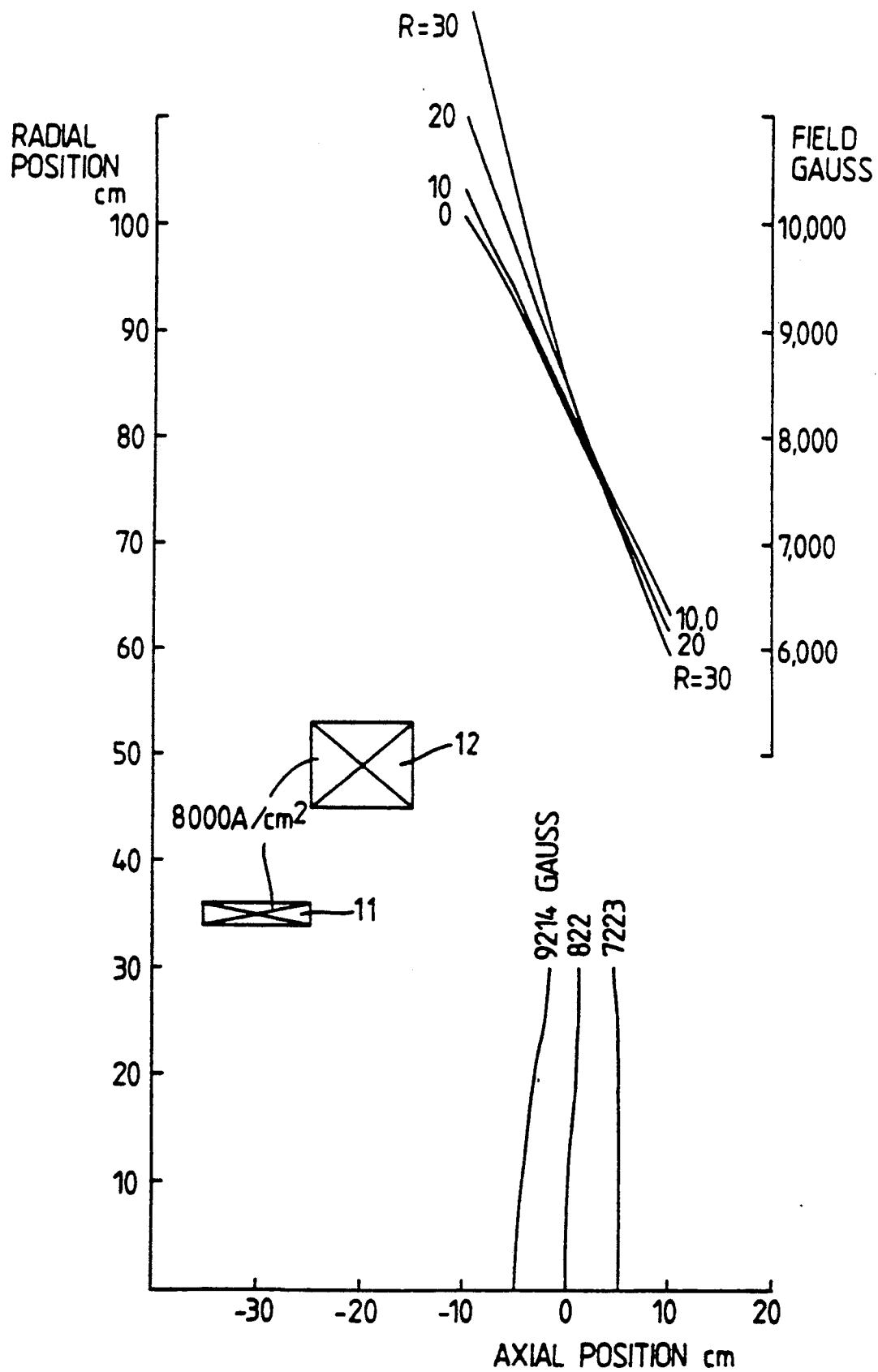
FIG. 4 illustrates graphically another example of an assembly according to the invention.

The data used to generate FIG. 4 is set out in Table 3 below.

TABLE 3

| Coil 11 | | |
|---|---|---|
| a1 | cm | 3.400E+001 |
| a2 | | 3.610E+001 |
| b1 | | −3.500E+001 |
| b2 | | −2.500E+001 |
| highest order | | 4.000/E+000 |
| Coil 12 | | |
| a1 | cm | 4.500E+001 |
| a2 | | 5.350E+001 |
| b1 | | −2.500E+001 |
| b2 | | −1.500E+001 |
| highest order | | 4.000E+000 |

Radial derivatives

H0 = 8.221E+003   H1 = 0.000E+000
H2 = −1.915E−002  H3 = 0.000E+000
H4 = −1.581E−002

Field plots

| Z | Hr | Hz | Hmod |
|---|---|---|---|
| R 0.000E+000 | | | |
| −1.000E+001 | 0.000E+000 | 1.012E+004 | 1.012E+004 |
| −7.500E+000 | 0.000E+000 | 9.685E+003 | 9.685E+004 |
| −5.000E+000 | 0.000E+000 | 9.214E+003 | 9.214E+004 |
| −2.500E+000 | 0.000E+000 | 8.723E+003 | 8.723E+003 |
| 0.000E+000 | 0.000E+000 | 8.221E+003 | 8.221E+003 |
| 2.500E+000 | 0.000E+000 | 7.719E+003 | 7.719E+003 |
| 5.000E+000 | 0.000E+000 | 7.223E+003 | 7.223E+003 |
| 7.500E+000 | 0.000E+000 | 6.740E+003 | 6.740E+003 |
| 1.000E+001 | 0.000E+000 | 6.273E+003 | 6.273E+003 |
| R 5.000E+000 | | | |
| −1.000E+001 | 4.252E+002 | 1.017E+004 | 1.018E+004 |
| −7.500E+000 | 4.628E+002 | 9.716E+003 | 9.727E+004 |
| −5.000E+000 | 4.883E+002 | 9.234E+003 | 9.247E+004 |
| −2.500E+000 | 5.027E+002 | 8.732E+003 | 8.747E+003 |
| 0.000E+000 | 5.074E+002 | 8.222E+003 | 8.238E+003 |
| 2.500E+000 | 5.037E+002 | 7.712E+003 | 7.729E+003 |
| 5.000E+000 | 4.933E+002 | 7.210E+003 | 7.227E+003 |
| 7.500E+000 | 4.775E+002 | 6.722E+003 | 6.739E+003 |
| 1.000E+001 | 4.576E+002 | 6.252E+003 | 6.269E+003 |
| R 1.000E+001 | | | |
| −1.000E+001 | 8.894E+003 | 1.030E+004 | 1.034E+004 |
| −7.500E+000 | 9.623E+003 | 9.808E+003 | 9.855E+003 |
| −5.000E+000 | 1.010E+003 | 9.290E+003 | 9.345E+003 |
| −2.500E+000 | 1.035E+003 | 8.757E+003 | 8.818E+003 |
| 0.000E+000 | 1.040E+003 | 8.219E+003 | 8.285E+003 |
| 2.500E+000 | 1.028E+003 | 7.687E+003 | 7.755E+003 |
| 5.000E+000 | 1.003E+003 | 7.167E+003 | 7.236E+003 |
| 7.500E+000 | 9.669E+003 | 6.665E+003 | 6.735E+003 |
| 1.000E+000 | 9.235E+003 | 6.185E+003 | 6.254E+003 |
| R 1.500E+001 | | | |
| −1.000E+001 | 1.436E+003 | 1.051E+004 | 1.061E+004 |
| −7.500E+000 | 1.539E+003 | 9.951E+003 | 1.007E+004 |
| −5.000E+000 | 1.601E+003 | 9.371E+003 | 9.507E+003 |

TABLE 3-continued

| | | | |
|---|---|---|---|
| −2.500E+000 | 1.627E+003 | 8.783E+003 | 8.933E+003 |
| 0.000E+000 | 1.622E+003 | 8.199E+003 | 8.358E+003 |
| 2.500E+000 | 1.592E+003 | 7.629E+003 | 7.794E+003 |
| 5.000E+000 | 1.543E+003 | 7.080E+003 | 7.246E+003 |
| 7.500E+000 | 1.478E+003 | 6.557E+003 | 6.721E+003 |
| 1.000E+001 | 1.404E+003 | 6.063E+003 | 6.223E+003 |
| R 2.000E+001 | | | |
| −1.000E+001 | 2.120E+003 | 1.079E+004 | 1.099E+004 |
| −7.500E+000 | 2.241E+003 | 1.013E+004 | 1.037E+004 |
| −5.000E+000 | 2.302E+003 | 9.452E+003 | 9.728E+003 |
| −2.500E+000 | 2.312E+003 | 8.784E+003 | 9.083E+003 |
| 0.000E+000 | 2.280E+003 | 8.135E+003 | 8.448E+003 |
| 2.500E+000 | 2.215E+003 | 7.513E+003 | 7.833E+003 |
| 5.000E+000 | 2.125E+003 | 6.926E+003 | 7.245E+003 |
| 7.500E+000 | 2.019E+003 | 6.377E+003 | 6.688E+003 |
| 1.000E+001 | 1.902E+003 | 5.867E+003 | 6.167E+003 |
| R 2.500E+001 | | | |
| −1.000E+001 | 3.007E+003 | 1.111E+004 | 1.151E+004 |
| −7.500E+000 | 3.125E+003 | 1.029E+004 | 1.076E+004 |
| −5.000E+000 | 3.160E+003 | 9.490E+003 | 1.000E+004 |
| −2.500E+000 | 3.125E+003 | 8.714E+003 | 9.257E+003 |
| 0.000E+000 | 3.036E+003 | 7.980E+003 | 8.538E+003 |
| 2.500E+000 | 2.908E+003 | 7.297E+003 | 7.855E+003 |
| 5.000E+000 | 2.755E+003 | 6.668E+003 | 7.215E+003 |
| 7.500E+000 | 2.586E+003 | 6.094E+003 | 6.620E+003 |
| 1.000E+001 | 2.411E+003 | 5.573E+003 | 6.072E+003 |
| R 3.000E+001 | | | |
| −1.000E+001 | 4.188E+003 | 1.143E+004 | 1.217E+004 |
| −7.500E+000 | 4.273E+003 | 1.040E+004 | 1.124E+004 |
| −5.000E+000 | 4.234E+003 | 9.409E+003 | 1.032E+004 |
| −2.500E+000 | 4.102E+003 | 8.492E+003 | 9.431E+003 |
| 0.000E+000 | 3.906E+003 | 7.660E+003 | 8.598E+003 |
| 2.500E+000 | 3.672E+003 | 6.916E+003 | 7.830E+003 |
| 5.000E+000 | 3.420E+003 | 6.255E+003 | 7.129E+003 |
| 7.500E+000 | 3.164E+003 | 5.670E+003 | 6.493E+003 |
| 1.000E+001 | 2.913E+003 | 5.153E+003 | 5.919E+003 |

Contour plots

| R | Z | dB/dZ | error |
|---|---|---|---|
| Z −5.000E+000 | | | |
| 0.000E+000 | −5.000E+000 | −1.924E+002 | 9.214E+003 |
| 2.500E+000 | −4.957E+000 | −1.934E+002 | 3.498E−006 |
| 5.000E+000 | −4.832E+000 | −1.966E+002 | 1.017E−005 |
| 7.500E+000 | −4.633E+000 | −2.018E+002 | 1.600E−005 |
| 1.000E+000 | −4.371E+000 | −2.090E+002 | 2.141E−005 |
| 1.250E+000 | −4.061E+000 | −2.182E+002 | 2.565E−005 |
| 1.500E+000 | −3.720E+000 | −2.292E+002 | 2.851E−005 |
| 1.750E+000 | −3.363E+000 | −2.421E+002 | 3.021E−005 |
| 2.000E+000 | −3.006E+000 | −2.568E+002 | 3.063E−005 |
| 2.250E+000 | −2.664E+000 | −2.734E+002 | 3.042E−005 |
| 2.500E+000 | −2.351E+000 | −2.923E+002 | 2.862E−005 |
| 2.750E+000 | −2.080E+000 | −3.138E+002 | 2.512E−005 |
| 3.000E+000 | −1.865E+000 | −3.383E+002 | 1.812E−005 |
| Z 0.000E+000 | | | |
| 0.000E+000 | 0.000E+000 | −2.007E+002 | 8.221E+003 |
| 2.500E+000 | 2.034E−002 | −2.015E+002 | 1.782E−006 |
| 5.000E+000 | 7.918E−002 | −2.037E+002 | 1.402E−005 |
| 7.500E+000 | 1.748E−001 | −2.073E+002 | 6.889E−006 |
| 1.000E+000 | 2.989E−001 | −2.124E+002 | 8.196E−006 |
| 1.250E+000 | 4.442E−001 | −2.189E+002 | 9.740E−006 |
| 1.500E+000 | 6.015E−001 | −2.268E+002 | 1.045E−005 |
| 1.750E+000 | 7.605E−001 | −2.362E+002 | 1.033E−005 |
| 2.000E+000 | 9.107E−001 | −2.470E+002 | 9.384E−006 |
| 2.250E+000 | 1.041E+000 | −2.595E+002 | 7.721E−006 |
| 2.500E+000 | 1.141E+000 | −2.736E+002 | 5.464E−006 |
| 2.750E+000 | 1.198E+000 | −2.896E+002 | 2.376E−006 |
| 3.000E+000 | 1.199E+000 | −3.077E+002 | 1.188E−007 |
| Z 5.000E+000 | | | |
| 0.000E+000 | 5.000E+000 | −1.959E+002 | 7.223E+003 |
| 2.500E+000 | 5.005E+000 | −1.964E+002 | 2.028E−007 |
| 5.000E+000 | 5.019E+000 | −1.979E+002 | 6.760E−007 |
| 7.500E+000 | 5.041E+000 | −2.004E+002 | 1.082E−006 |
| 1.000E+000 | 5.066E+000 | −2.040E+002 | 1.284E−006 |
| 1.250E+000 | 5.090E+000 | −2.085E+002 | 1.149E−006 |
| 1.500E+000 | 5.107E+000 | −2.141E+002 | 6.760E−007 |
| 1.750E+000 | 5.111E+000 | −2.207E+002 | 6.760E−008 |
| 2.000E+000 | 5.095E+000 | −2.284E+002 | 6.760E−007 |
| 2.250E+000 | 5.049E+000 | −2.372E+002 | 1.217E−006 |
| 2.500E+000 | 4.996E+000 | −2.472E+002 | 1.284E−006 |
| 2.750E+000 | 4.837E+000 | −2.585E+002 | 2.028E−007 |

TABLE 3-continued

| | | | |
|---|---|---|---|
| 3.000E+000 | 4.650E+000 | −2.711E+002 | 4.732E−006 |

In order to carry out an NMR experiment within the working region 5, it can be desirable to remove dynamically the static magnetic field gradient which exists in the axial direction. This can be done in a variety of ways such as that illustrated by way of example with reference to FIG. 5 in connection with spin echo imaging. In the particular case shown, the slice selection direction is chosen to be in the axial direction relative to the main magnetic field. This sequence comprises a frequency (and therefore spatially) selective 90 degree RF pulse P1, followed by a non-selective re-phasing 180 degree pulse, P2, which create echo E1. The dynamically applied gradient sequence is labelled "Applied Read Gradient", "Applied Phase Encode Gradient" and "Applied Slice Gradient". Taking these in order, the Read Gradient is applied in the radial direction and is essentially the same as is required within the bore of a conventional imaging magnet. In this direction, the spin system is de-phased after the selective pulse P1 and re-phased after the non selective pulse P2 to form the echo which is detected and digitized as normal. Likewise, the phase encode gradient is applied between the two pulses, P1 and P2, and its amplitude is varied in each successive application to provide a second dimension of spatial encoding and thus a full two dimensional image. The applied Slice Gradient produces the desired slice gradient in conjunction with the static field gradient, the static gradient being inherent to the main magnetic field system.

In detail, at time marked A no gradient is dynamically applied during the course of the selective radio frequency pulse P1 which is designed to rotate just the selected spins. After the pulse P1 is over, a gradient pulse is applied between points marked B and C, to rephase the spins to produce a coherent signal. Typically, as is well known to those skilled in the art, this gradient must be in the reverse direction to that present during the pulse. If the pulse P1 is both amplitude and or phase modulated the rotated spins may still be in phase following RF excitation in which case the gradient portion B to C will not be required to be different to the amplitude during period C to D. Following point C, a gradient field is applied throughout the remainder of the sequence until the echo has been sampled at point D, and then can be removed until a subsequent sequence.

As with conventional imaging, a selective pulse can be used in place of P2, again with the appropriate offset added to the conventional slice gradient during the selective 180 degree RF re-phase process. In this way, a multi-slice imaging procedure can be performed by the conventional technique of changing the radio frequency for each slice.

The same principle can be applied to the read and phase encode gradients. The same style of addition of static offset should be applied to any gradient pulses that are applied in the axial direction.

We claim:

1. A magnetic field generating assembly comprising:
at least two magnetic field generators for generating magnetic fields in the same sense, the generators being arranged such that in use in a working region external to the generators the resultant magnetic field exhibits a gradient extending in a first direction, the generators being substantially coaxial electrical coils with the axis extending in the first direction, and wherein at least second order variations in the fields in directions transverse to the first direction within the region are substantially balanced such that an NMR experiment can be performed on a sample within the working region.

2. An assembly according to claim 1, wherein the centres of the coils are offset along the axis.

3. An assembly according to claim 1, wherein the working region is substantially planar.

4. An assembly according to claim 1, wherein the working region is substantially dish shaped.

5. An assembly according to claim 1, wherein homogeneity of the field in the working region in directions transverse to the first direction is better than 100 ppm.

6. An assembly according to claim 1, wherein at least second and fourth order variations in the fields in directions transverse to the first direction are substantially balanced in the working region.

7. Apparatus for performing an NMR experiment, the apparatus comprising:
an assembly having at least two magnetic field generators for generating magnetic fields in the same sense, the generators being arranged such that in use in a working region external to the generators the resultant magnetic field exhibits a gradient extending in a first direction, the generators being substantially coaxial electrical coils with the axis extending in the first direction, and wherein at least second order variations in the fields in directions transverse to the first direction within the region are substantially balanced such that an NMR experiment can be performed on a sample within the working region;
RF magnetic field generating means for generating an RF magnetic field in the working region; and
detection means for detecting the resultant signal echo.

8. Apparatus according to claim 7, further comprising gradient magnetic field generating means for generating magnetic field gradients in the working region transverse to the first direction.

9. An assembly according to claim 7, wherein the working region is substantially planar.

10. An assembly according to claim 7, wherein the working region is substantially dish shaped.

11. An apparatus according to claim 7, wherein homogeneity of the field in the working region in directions transverse to the first direction is better than 100 ppm.

12. An apparatus according to claim 7, wherein at least second and fourth order variations in the fields in directions transverse to the first direction are substantially balanced in the working region.

13. A method of inspecting a structure comprising:
(a) generating magnetic fields in the same sense by at least two magnetic field generators, the generators being arranged such that in use in a working region external to the generators the resultant magnetic field exhibits a gradient extending in a first direction, the generators being substantially coaxial electrical coils with the axis extending in the first direction, and wherein at least second order variations in the fields in directions transverse to the first direction within the working region are substantially balanced such that inspection of a structure can be performed on a sample within the working region;

(b) generating a set of substantially planar or curved regions in each of which a magnetic field is generated which is substantially homogeneous, the magnitude of the field within each region differing between the regions;

(c) positioning a structure to be inspected such that it intersects at least one of the homogeneous regions;

(d) exposing the structure to a RF pulse at a predetermined frequency band to excite the nuclear magnetic resonance within the structure; and (e) monitoring the resulting signal echo.

14. A method according to claim 13, further comprising gradient magnetic field generating means for generating magnetic field gradients in the working region transverse to the first direction.

* * * * *